United States Patent [19]

Moriizumi et al.

[11] Patent Number: 5,496,971
[45] Date of Patent: Mar. 5, 1996

[54] CIRCUIT ARRANGEMENT FOR MULTILAYER PRINTED CIRCUIT BOARD

[75] Inventors: Kiyokazu Moriizumi; Mikio Nishihara, both of Kawasaki, Japan

[73] Assignee: Fujitsu Limited, Kawasaki, Japan

[21] Appl. No.: 297,419

[22] Filed: Aug. 29, 1994

[30] Foreign Application Priority Data

Sep. 29, 1993 [JP] Japan .................................. 5-242924

[51] Int. Cl.$^6$ ................................................. H05K 1/02
[52] U.S. Cl. ...................... 174/255; 174/261; 174/262; 174/264; 361/792
[58] Field of Search ............................. 174/250, 255, 174/261, 262, 263, 264, 26, 266, 251, 254; 361/784, 792, 805; 439/48

[56] References Cited

U.S. PATENT DOCUMENTS

| | | | |
|---|---|---|---|
| 4,791,238 | 12/1988 | Kanno et al. | 174/68.5 |
| 4,859,806 | 8/1989 | Smith | 174/68.5 |
| 5,360,948 | 11/1994 | Thornberg . | |
| 5,360,949 | 11/1994 | Duxbury . | |
| 5,438,166 | 8/1995 | Carey et al. | 174/261 |

*Primary Examiner*—Laura Thomas
*Attorney, Agent, or Firm*—Armstrong, Westerman, Hattori, McLeland & Naughton

[57] ABSTRACT

In a circuit arrangement for a multilayer printed circuit board, a first circuit layer is formed on a substrate, and comprises a dielectric layer having a circuit pattern formed thereon. A second circuit layer is further formed on the first circuit layer, and comprises a dielectric layer having a circuit pattern formed thereon. The first circuit pattern includes conductive segments having only an X-directional component, and the second circuit pattern includes conductive segments having only an Y-directional component perpendicular to the X-directional component. Electric connections between the X-directional segments and the Y-directional segments are suitably established by vias provided in the second layer. The first circuit pattern further includes slant conductive segments having both the X- and Y-directional components and arranged in a blank zone not occupied by the X-directional segments, and the second circuit pattern further includes slant conductive segments having both the X- and Y-directional components and arranged in a blank zone not occupied by the Y-directional segments. Electric connections between the slant segments of the first pattern and the slant segments of the second pattern are suitably established by vias provided in the second layer.

3 Claims, 2 Drawing Sheets

CIRCUIT ARRANGEMENT FOR MULTILAYER PRINTED CIRCUIT BOARD

FIELD OF THE INVENTION

The present invention relates to a circuit arrangement for a multilayer printed circuit board on which a plurality of electronic devices such as IC devices, LSI devices or the like are mounted, and more particularly to a circuit arrangement which may be suitably and advantageously embodied in a high-density multilayer printed circuit board.

DESCRIPTION OF THE RELATED ART

As a high-density multilayer printed circuit board, a thin-film type multilayer printed circuit board is well known, which includes a substrate made of, for example, a suitable ceramic material, and at least two circuit layers successively formed on the substrate. Each of the circuit layers comprises a thin dielectric or insulating film layer having a circuit pattern formed thereon, and the film layer may be made of a polyimide resin. For example, the circuit pattern of the first circuit layer directly formed on the substrate includes a plurality of conductive segments having only an X-directional component, and the other circuit pattern of the second circuit layer formed on the first circuit layer includes a plurality of conductive segments having a Y-directional component perpendicular to the X-directional component. Electrical connections between the X-directional conductive segments and the Y-directional conductive segments are suitably made by vias provided in the second circuit layer, whereby electrical connections between electronic devices to be mounted on the print-circuit board can be established through a combination of the X-directional conductive segments and the Y-directional conductive segments.

Among the electronic devices to be mounted on the printed circuit board, there may be a specific type of electronic device which requires that its electrical connection to another electronic device be a given short conductive distance. Namely, the conductive distance between these electronic devices must fall within a permissible range. This problem may be resolved by arranging the two electronic devices concerned to be as close as possible to each other on the printed circuit board. Nevertheless, there are cases where the electronic devices concerned cannot be arranged to be close to each other due to various restrictions of design on the printed circuit board. In the this case, the printed circuit board additionally includes at least one circuit layer formed on the second circuit layer thereof, and this third circuit layer also comprises a polyimide resin film layer having a circuit pattern formed thereon and including slant conductive segments having both Y-directional and X-directional components. Each of the slant conductive segments is oriented so as to electrically connect the two electronic devices concerned to each other by the shortest conductive distance.

For example, when the two electronic devices are connected to each other by X-directional and Y-directional segments which have the same length L, a conductive distance between the electronic devices is substantially equal to 2 L. However, when the abovementioned two electronic devices are connected to each other by a slant conductive segment which is oriented to define an angle of 45 degrees with respect the X-direction or Y-direction, the conductive distance between the electronic devices is substantially equal to $\sqrt{2}L$. Accordingly, by using the slant conductive segment as mentioned above, the conductive distance between the electronic devices can be shortened by $(2-\sqrt{2}) L$.

Nevertheless the formation of an additional circuit layer on the printed circuit board is unwise because it results in increased production costs.

SUMMARY OF THE INVENTION

Therefore, an object of the present invention is to provide a circuit arrangement for a multilayer printed circuit board on which a plurality of electronic devices are mounted, wherein formation of an additional circuit layer on the printed circuit board is unnecessary for shortening a conductive distance between two electronic devices to be electrically connected to each other.

In accordance with the present invention, there is provided a circuit arrangement for a multilayer printed circuit board, comprising: a substrate member; a first circuit layer formed on the substrate member, the first circuit layer having a circuit pattern which includes conductive segments having only an X-directional component; a second circuit layer formed on the first circuit layer, the second circuit layer having a circuit pattern which includes conductive segments having only a Y-directional component perpendicular to the X-directional component; and electrical connections between the X-directional conductive segments and the Y-directional conductive segments being suitably established by vias provided in the second circuit layer, wherein the circuit pattern of the first circuit layer further includes slant conductive segments having both X-directional and the Y-directional components and arranged in a blank zone which is not occupied by the X-directional conductive segments, and the circuit pattern of the second circuit layer further including slant conductive segments having both X-directional and Y-directional components and arranged in a blank zone which is not occupied by the Y-directional conductive segments; electrical connections between the slant conductive segments of the first circuit layer and the slant conductive segments of the second circuit layer being suitably established by vias provided in the second circuit layer.

Preferably, The first circuit layer comprises a polyimide layer, on which the circuit pattern thereof is formed, and the second circuit layer also comprises a polyimide layer on which the circuit pattern thereof is formed.

BRIEF DESCRIPTION OF THE DRAWINGS

The other objects and advantages of the present invention will be better understood from the following description, with reference to the accompanying drawings, in which.

DESCRIPTION OF THE PREFERRED EMBODIMENTS

Figure 1:
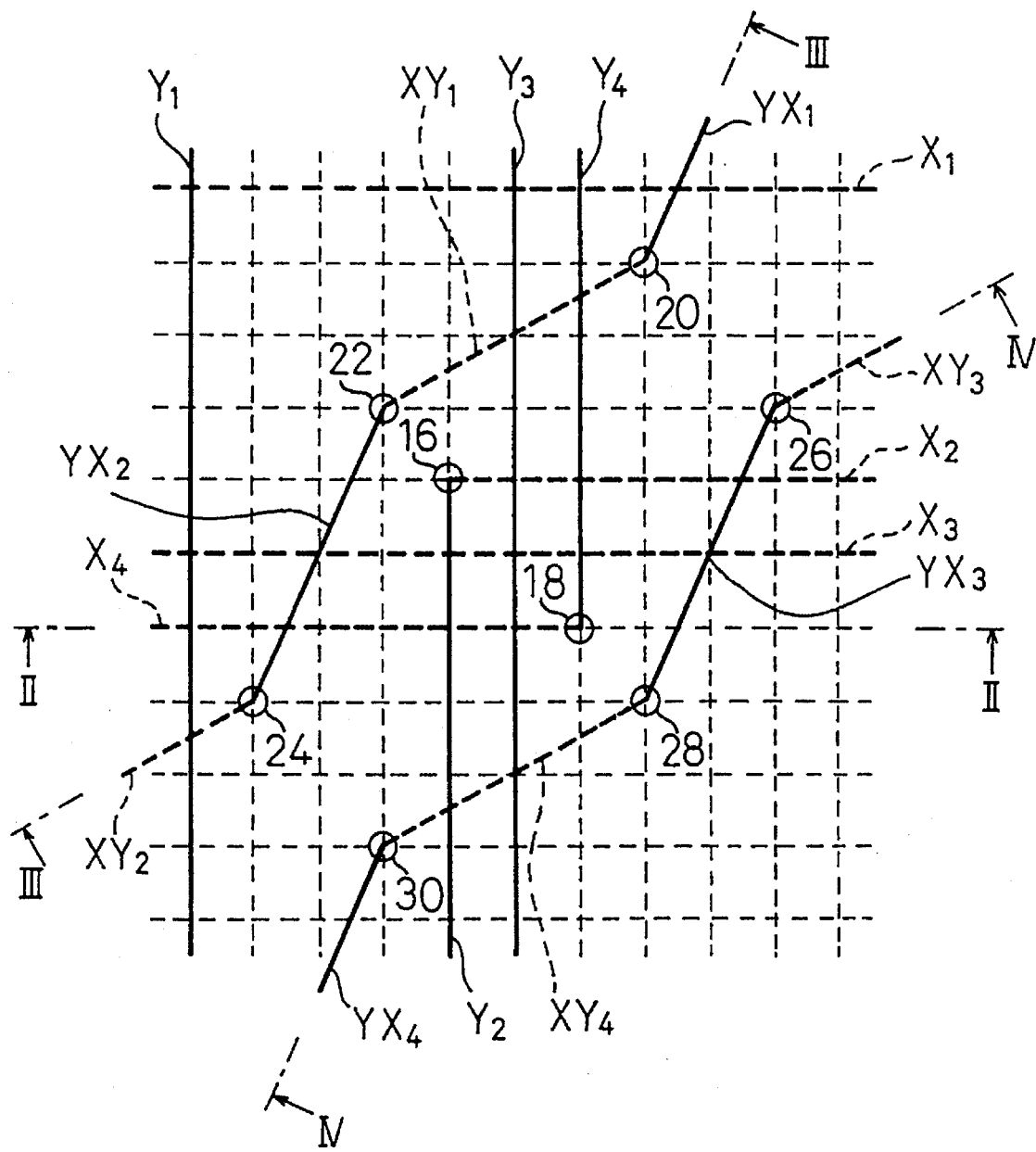
FIG. 1 is a plan view partially and schematically showing a thin-film type multi-layer print-circuit board constituted according to the present invention.
Figure 2:
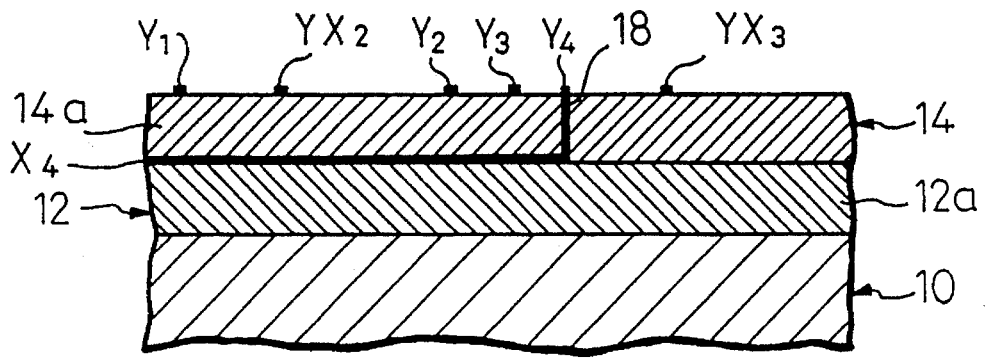
FIG. 2 is a cross-sectional view taken along the line II—II of FIG. 1.

A thin-film type multi-layer printed circuit board shown in FIG. 1 comprises a substrate 10 preferably made of a ceramic material, a first circuit layer 12 formed on the substrate 10, and a second circuit layer 14 formed on the first circuit layer 12. The first circuit layer 12 comprises a thin dielectric or insulating film layer 12a having a circuit pattern formed thereon. Similarly, the second circuit layer 14 comprises a thin dielectric or insulating film layer 14a having a circuit pattern formed thereon. The film layers 12a and 14a may be made of a polyimide resin.

The circuit pattern of the first circuit layer 12 includes a plurality of conductive segments having only an X-directional component, and four of these X-directional segments are shown by thick broken lines and are indicated by references $X_1$ to $X_4$ in FIG. 1. Also, the circuit pattern of the second circuit layer 14 includes a plurality of conductive segments having only a Y-directional component perpendicular to the X-directional component, and four of these Y-directional segments are shown by thick solid lines and are indicated by reference $Y_1$ to $Y_4$ in FIG. 1. A geometrical latticing, which is conveniently shown by thin broken lines in FIG. 1, indicates a basic pitch unit, on the basis of which the X-directional and Y-directional conductive segments are arranged. Note that the basic pitch unit may be mainly determined by the number of electronic devices to be mounted on the printed circuit board.

The film layer 14a has vias provided therein for suitably establishing electrical connections between the X-directional conductive segments and the Y-directional conductive segments. In the example shown in FIG. 1, the X-directional conductive segment $X_2$ is electrically connected to the Y-directional conductive segment $Y_2$ by a via 16, and the X-directional conductive segment $X_4$ is electrically connected to the Y-directional conductive segment $Y_4$ by a via 18. Note that each of the X-directional conductive segments $X_1$ and $X_3$ is suitably connected to a Y-directional conductive segment (not shown) by vias provided at a location not shown in FIG. 1, and also that each of the Y-directional conductive segments $Y_1$ and $Y_3$ is suitably connected to an X-directional conductive segment (not shown) by a via provided at a location not shown in FIG. 1.

According to the present invention, the circuit pattern of the first circuit layer 12 further includes slant conductive segments having both X-directional and Y-directional components, and four of these slant conductive segments are shown by thick broken lines and are indicated by references $XY_1$ to $XY_4$ in FIG. 1. The slant conductive segments ($XY_1$ to $XY_4$) are arranged in a blank zone of the film layer 12a which is not occupied by the X-directional conductive segments ($X_1$ to $X_4$). Similarly, the circuit pattern of the second circuit layer 14 further includes slant conductive segments having both the X-directional and Y-directional components, and four of these slant conductive segments are shown by thick solid lines and are indicated by references $YX_1$ to $YX_4$ in FIG. 1. The slant conductive segments ($YX_1$ to $YX_4$) are arranged in a blank zone of the film layer 14a which is not occupied by the Y-directional conductive segments ($Y_1$ to $Y_4$).

Figure 3:
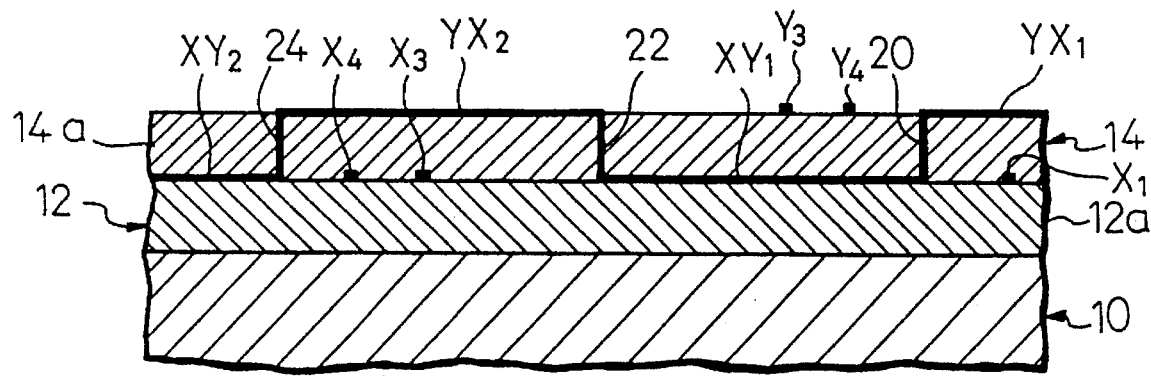
FIG. 3 is a cross-sectional view taken along the line III—III of FIG. 1.
Figure 4:
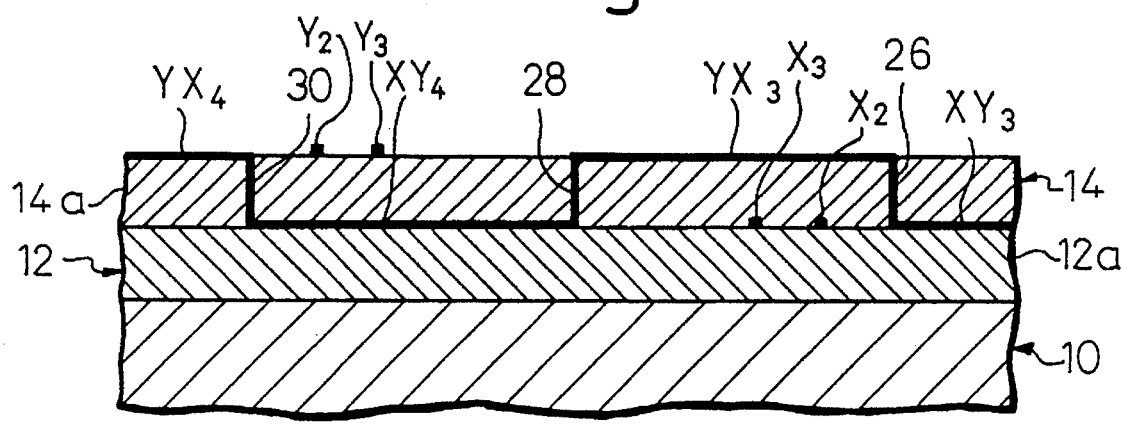
FIG. 4 is a cross-sectional view taken along the line IV—IV of FIG. 1.

The film layer 14a further has vias provided therein for suitably establishing electrical connections between the slant conductive segments ($XY_1$ to $XY_4$) of the first circuit layer 12 and and the slant conductive segments ($YX_1$ to $YX_4$) of the second circuit layer 14. In the example shown in FIG. 1, the slant conductive segments $YX_1$, $XY_1$, $YX_2$, and $XY_2$ are successively connected by vias 20, 22, and 24 provided in the film layer 14a, as best shown in FIG. 3, and the conductive segments $XY_3$, $YX_3$, $XY_4$, and $YX_4$ are successively connected by vias 26, 28, and 30 provided in the film layer 14a, as best shown in FIG. 4. Of course, the conductive line formed by the conductive segments $XY_3$, $YX_3$, $XY_4$, and $YX_4$ or the conductive segments $XY_3$, $YX_3$, $XY_4$, and $YX_4$ is used for a specific type of electronic device which requires an electrical connection of a given short conductive distance to another electronic device.

Note that some of the conductive segments inclusive of the Y-directional conductive segments and the slant conductive segments, which appear on the surface of the film layer 14a, have a pad integrally formed therewith, and a given lead or terminal of an electronic device to be mounted on the printed circuit board is soldered to that pad.

A method for production of the thin-film type multilayer printed-circuit board as mentioned above is not explained in detail herein because it is well known. The production method may be summarized as follows:

a) First, a ceramic substrate (10) is spin-coated with a polyimide precursor, and the coated polyimide precursor is then polymerized so that a thin film polyimide layer (12a) is formed on the substrate.

b) The polyimide layer (12a) is coated with a suitable metal material such as copper by, for example, a sputtering process, so that a conductive metal film is formed on the polyimide layer (12a).

c) The conductive metal film is treated by a photolithographic process such that a circuit pattern including X-directional conductive segments ($X_1$ to $X_4$) and slant conductive segments ($XY_1$ to $XY_4$) are formed on the polyimide layer (12a), and thus a first circuit layer (12) is created on the substrate (10).

d) A second thin film polyimide layer (14a) is formed on the first circuit layer (12) by the same process as the first polyimide layer (12a), and is then treated by a photolithographic process such that fine holes for forming vias (16, 18, 20, 22, 24, 26, 28, 30) are formed in the second polyimide layer (14a).

e) The second polyimide layer (14a) is coated with a suitable metal material such as copper by, for example, a sputtering process, so that a conductive metal film is formed on the polyimide layer (14a). Note that during the sputtering process, the fine holes formed in the second polyimide layer (14a) are filled with the sputtered metal material, and thus the vias (16, 18, 20, 22, 24, 26, 28, 30) are formed therein.

f) The conductive metal film formed on the second polyimide layer (14a) is treated by a photolithographic process such that a circuit pattern including Y-directional conductive segments ($Y_1$ to $Y_4$) and slant conductive segments ($YX_1$ to $YX_4$) are formed on the second polyimide layer (14a), and thus a second circuit layer (14) is created on the first circuit layer (12).

According to the production method as mentioned above, the arrangement of the conductive segments on each polyimide layer can be easily carried out at a high density.

In the illustrated embodiment, although a slant angle of the slant conductive segments ($XY_1$ to $XY_4$) of the first circuit layer 12 is different from that of the slant conductive segments ($YX_1$ to $YX_4$) of the second circuit layer 14, both of the slant angles may be the same. Also, the individual slant conductive segments may be arranged at different slant angles.

Finally, it will be understood by those skilled in the art that the foregoing description is of a preferred embodiment of the disclosed invention, and that various changes and modifications may be made to the present invention without departing from the spirit and scope thereof.

We claim:

1. A circuit arrangement for a multilayer printed circuit board, comprising:

a substrate member;

a first circuit layer comprising a first dielectric layer formed on said substrate member, said first circuit layer having a circuit pattern formed on said first dielectric layer which includes conductive segments having only an X-directional component;

a second circuit layer comprising a second dielectric layer formed on said first circuit layer, said second circuit layer having a circuit pattern formed on said second dielectric layer which includes conductive segments having only a Y-directional component perpendicular to said X-directional component; and electrical connections between said X-directional conductive segments and said Y-directional conductive segments being suitably established by vias provided in said second circuit layer, wherein the circuit pattern of said first circuit layer further includes slant conductive segments having both X-directional and Y-directional components and arranged in a blank zone which is not occupied by said X-directional conductive segments, and the circuit pattern of said second circuit layer further includes slant conductive segments having both X-directional and Y-directional components and arranged in a blank zone which is not occupied by said Y-directional conductive segments; electrical connections between the slant conductive segments of said first circuit layer and the slant conductive segments of said second circuit layer being suitably established by vias provided in said second circuit layer.

2. A circuit arrangement as set forth in claim 1, wherein said vias are provided in the dielectric layer of said second circuit layer.

3. A circuit arrangement as set forth in claim 1, wherein each of said dielectric layers is made of a polyimide resin.

* * * * *